United States Patent
Konno (10) Patent No.: US 7,724,539 B2
(45) Date of Patent: May 25, 2010

(54) HOLDER FOR A SMALL-SIZED ELECTRONIC PART

(75) Inventor: Hideaki Konno, Tokyo (JP)

(73) Assignee: Polymatech Co., Ltd., Tokyo (JP)

(*) Notice: Subject to any disclaimer, the term of this patent is extended or adjusted under 35 U.S.C. 154(b) by 923 days.

(21) Appl. No.: 11/504,653

(22) Filed: Aug. 16, 2006

(65) Prior Publication Data
US 2007/0041165 A1 Feb. 22, 2007

(30) Foreign Application Priority Data
Aug. 18, 2005 (JP) .............................. 2005-237642

(51) Int. Cl.
*H05K 5/02* (2006.01)
(52) U.S. Cl. .................... 361/807; 361/730; 361/809; 439/500; 174/520
(58) Field of Classification Search .............. 361/807, 361/809, 730; 439/500; 174/520
See application file for complete search history.

(56) References Cited

U.S. PATENT DOCUMENTS

| | | | | |
|---|---|---|---|---|
| 4,053,688 | A * | 10/1977 | Perkins et al. ............... | 429/98 |
| 5,830,007 | A * | 11/1998 | Fry et al. ..................... | 439/500 |
| 5,831,827 | A * | 11/1998 | Fekete et al. ................ | 361/728 |
| 6,217,349 | B1 * | 4/2001 | Konno ......................... | 439/91 |
| 6,307,946 | B1 * | 10/2001 | Fujimoto et al. ............. | 381/355 |
| 6,549,636 | B2 * | 4/2003 | Fujimoto et al. ............. | 381/368 |
| 6,561,823 | B1 * | 5/2003 | Konno ......................... | 439/91 |
| 6,613,267 | B1 * | 9/2003 | Konno ......................... | 264/437 |
| 6,773,300 | B1 * | 8/2004 | Sudo et al. .................. | 439/500 |
| 7,054,458 | B2 * | 5/2006 | Ito et al. ...................... | 381/355 |
| 7,277,299 | B2 * | 10/2007 | Yoshida ....................... | 361/807 |
| 7,400,875 | B2 * | 7/2008 | Konno ......................... | 455/349 |

FOREIGN PATENT DOCUMENTS

| | | |
|---|---|---|
| EP | 0 880 299 A1 | 11/1998 |
| EP | 0 938 247 A1 | 8/1999 |
| JP | 11-191469 | 7/1999 |
| JP | 2001-359194 | 12/2001 |

OTHER PUBLICATIONS

Communication from European Patent Office for application No. 06016674.1-2214 dated Sep. 11, 2007.
Office Action from Chinese Patent App. No. 2006101108593 (Jun. 5, 2009).

* cited by examiner

*Primary Examiner*—Dameon E Levi
(74) *Attorney, Agent, or Firm*—Cermak Kenealy Vaidya & Nakajima LLP; Tomoko Nakajima (57) ABSTRACT

According to the present invention, there is provided a holder having a pressure flange not to be easily disengaged from a small-sized electronic part in pressing and accommodating the holder having the small-sized electronic part in a mounting recess. A holder includes a projecting portion protruding from a pressing flange toward a cylinder axis of a holding portion, formed in a portion having a predetermined length of an inner edge of the pressing flange. With this construction, when the holder accommodating a small-sized electronic part is mounted to a casing of an apparatus, even if the pressing flange is rolled up and about to be disengaged from the small-sized electronic part, the projecting portion engages with the small-sized electronic part, thereby preventing the pressing flange from being rolled up.

22 Claims, 10 Drawing Sheets

HOLDER FOR A SMALL-SIZED ELECTRONIC PART

BACKGROUND OF THE INVENTION

1. Field of the Invention

The present invention relates to a holder for holding a small-sized electronic part to be built in an apparatus (herein, referred to as "mounting object apparatus") such as a mobile phone, a personal handy-phone system (PHS), or a personal digital assistant (PDA), examples of the small-sized electronic part including a microphone, a speaker, a receiver, a vibrator, a buzzer, and an electronic part which is a functional combination of those, and for electrically connecting electrodes of the small-sized electronic part to circuit electrodes of a board.

2. Description of the Related Art

As a technique for obtaining an electrical connection between electrodes of the small component and circuit electrodes of a board, there is known a technique using a holder for the small-sized electronic part, which is disclosed in JP 11-191469 A.

Figure 9A:
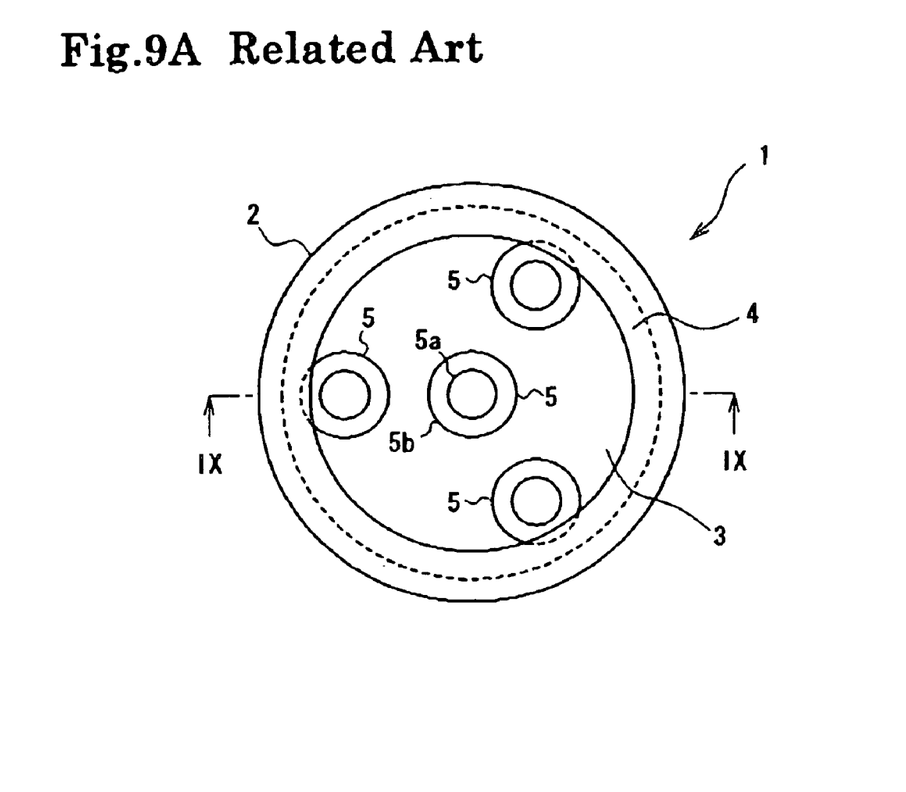
FIG. 9A is a plan view and FIG. 9B is a sectional view taken along the line IX-IX of FIG. 9.
Figure 9B:
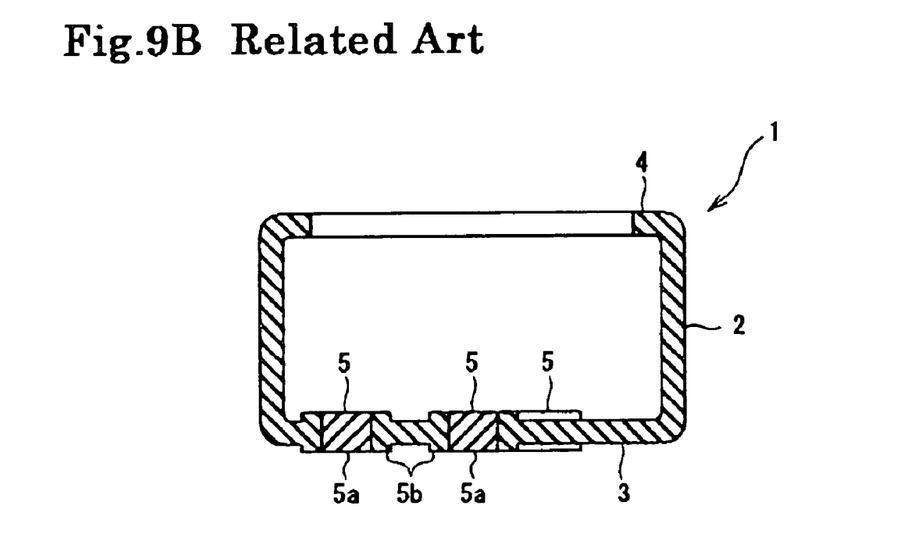

FIGS. 9A and 9B each show a conventional holder (1) for the small-sized electronic part. The holder (1) includes a cylindrical holding portion (2), a bottom portion (3) for closing one end side of the holding portion (2), and an annular pressing flange (4) protruding inwardly from the other end side of the holding portion (2). The holder (1) is a mold body formed of a soft rubber-like elastic material having electrical insulation properties such as silicone rubber. In this conventional example, in the bottom portion (3) of the holder (1), there are provided four elastic connector portions (5) thicker than the bottom portion (3). At a center of each of the elastic connector portions (5), a conduction path (5a) is formed. The conduction path (5a) is formed of fine granular magnetic conductive materials such as nickel grains. That is, the conduction path (5a) is formed by arranging the magnetic conductive materials, which is mixed in advance with liquid silicone rubber constituting a material resin of the holder (1), in a magnetic orientation along an axial direction of the conduction path (5a) during a molding process of the holder (1). A portion of the elastic connector portion (5) other than the conduction path (5a), that is, an outer peripheral portion (5b) is formed for retaining a shape of the conduction path (5a) and for stabilizing the electrical connection through the conduction path (5a).

Figure 10:
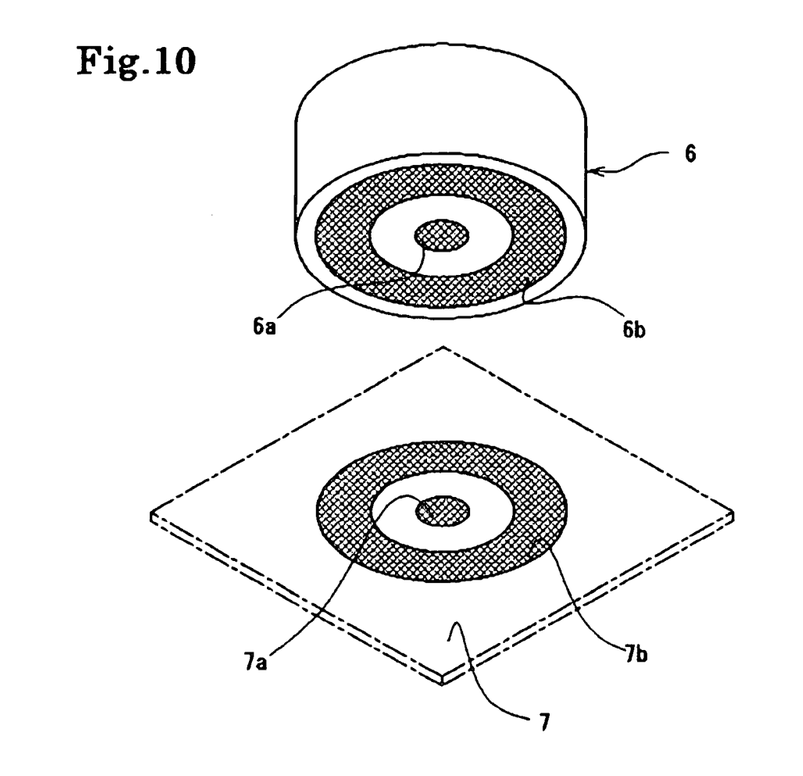
FIG. 10 is an explanatory view schematically showing electrodes of a small-sized electronic part and circuit electrodes of a board.
Figure 11:
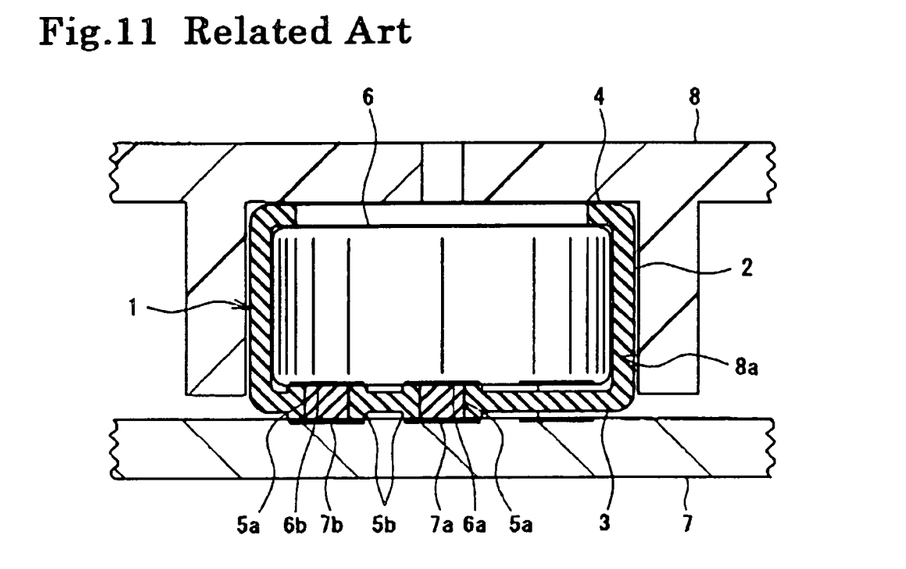
FIG. 11 is a sectional view for explaining a use state of the holder of FIGS. 9A and 9B.

The holder (1) is used, for example, for electrically connecting electrodes (6a, 6b) of the small-sized electronic part (6) and circuit electrodes (7a, 7b) of a board (7) provided to a mounting object apparatus such as a mobile phone shown in FIG. 10. To perform electrical connection, first, an inner edge of the pressing flange (4) is pressed to be widened, and then, the small-sized electronic part (6) is accommodated in the holding portion (2). Next, as shown in FIG. 11, the holder (1) accommodating the small-sized electronic part (6) is mounted to a mounting recess (8a) formed in an inner surface of a casing (8) of the mounting object apparatus (for example, mobile phone) by inserting in the mounting recess (8a). When the casing (8) is combined with another casing (not shown) or when the board (7) is fixed to the casing (8), the conduction path (5a) of the elastic connector portion (5) contacting with the electrodes (6a, 6b) of the small-sized electronic part (6) comes into contact with the circuit electrodes (7a, 7b) of the board (7). In this state, the pressing flange (4) functions to press the small-sized electronic part (6) to the board (7). As described above, the electrodes (6a, 6b) of the small-sized electronic part (6) is electrically connected to the circuit electrodes (7a, 7b) of the board (7) through the conduction path (5a) of the holder (1).

Note that, as described above, an operation of mounting the holder (1) accommodating the small-sized electronic part (6) to the mounting recess (8a) of the casing (8) is manually conducted most of the time, so utmost attention is essential for the operation.

Figure 12:
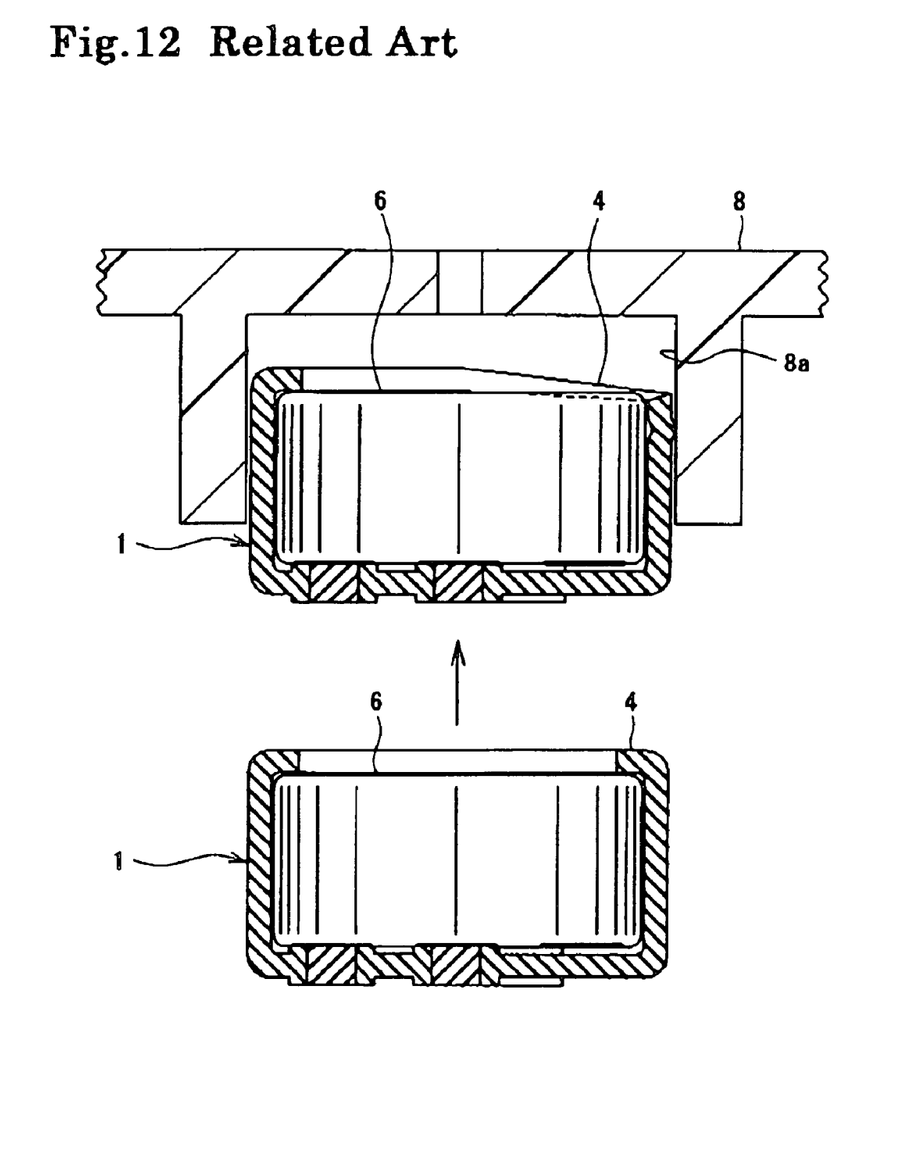
FIG. 12 is a sectional view for explaining mounting of the holder of FIGS. 9A and 9B to a mounting recess.

In terms of the background of miniaturizing the mounting object apparatus of the small-sized electronic part (6) and miniaturizing the small-sized electronic part (6) itself, the inner edge of the pressing flange (4) of the conventional holder (1) is formed to be identical in shape with and to have a diameter smaller than those of the small-sized electronic part (6). That is, an attention is paid such that the pressing flange (4) engages with the small-sized electronic part (6), whereby the small-sized electronic part (6) does not disengage from the holder (1). However, as shown in FIG. 12, in the case of mounting the holder (1) to the mounting recess (8a), when the holder (1) is rubbed against an inner peripheral surface of the mounting recess (8a) while being pushed therein, the pressing flange (4) is rolled up in its partial or entire periphery, thereby releasing the engagement with the small-sized electronic part (6). In this state, when the holder (1) is accommodated in the mounting recess (8a) and is combined with the board (7), the small-sized electronic part (6) cannot be pressed at a portion where the pressing flange (4) is rolled up. Further, when the pressing flange (4) is rolled up in its entire periphery, there is a fear in that the small-sized electronic part (6) cannot be held in press contact with the conduction path (5a) of the holder (1), thereby being spaced apart from the conduction path (5a). In both cases, pressure with respect to the small-sized electronic part (6) is uneven, thereby causing a fear of a contact failure due to an unstable electrical connection of the electric connector portion (5) through the conduction path (5a).

SUMMARY OF THE INVENTION

The present invention has been made in view of the background of the conventional technique as described above. It is an object of the present invention to prevent, in pressing and accommodating a holder having a small-sized electronic part in a mounting recess, a pressing flange from being disengaged from a small-sized electronic part.

To achieve the above-mentioned object, according to a first aspect of the present invention, there is provided a holder for a small-sized electronic part including a cylindrical holding portion for accommodating the small-sized electronic part, an elastic connector portion provided on one end side of the holding portion and having a conduction path for bringing electrodes of the small-sized electronic part accommodated in the holding portion and board electrodes into conduction, and a pressing flange, provided on the other side of the holding portion, having an inner edge which may protrude toward a cylinder axis of the holding portion and which can form an insertion hole into which the small-sized electronic part can be inserted, is characterized in that a projecting portion which further protrudes toward the cylinder axis of the holding portion is provided in a portion having a predetermined length of an inner edge of the pressing flange.

According to the first aspect of the present invention, the portion having the predetermined length of the inner edge of the pressing flange is provided with the projecting portion protruding toward the cylinder axis of the holding portion from the pressing flange. Therefore, even if the pressing flange is rolled up to be about to disengage from the small-sized electronic part, the projecting portion may engage with the small-sized electronic part, thereby preventing the pressing flange from being rolled up.

According to a second aspect of the present invention, a holder for a small-sized electronic part including a cylindrical holding portion for accommodating the small-sized electronic part and an elastic connector portion provided on one end side of the holding portion and having a conduction path for bringing electrodes of the small-sized electronic part accommodated in the holding portion and board electrodes into conduction, is characterized in that a projecting portion which further protrudes toward a cylinder axis of the holding portion is provided in a portion having a predetermined length of an inner edge on the other end side of the holding portion.

The holder according to the first aspect of the present invention may include the pressing flange on the holding portion. However, even in the holder according to the second aspect of the present invention having no pressing flange, by providing the projecting portion further protruding toward the cylinder axis of the holding portion in the portion having the predetermined length of the inner edge on the other end side of the holding portion, when the holder having the small-sized electronic part is pressed and mounted to the mounting recess, the projecting portion is not rolled up to cause disengagement. Accordingly, the holder according to the second aspect can be securely engaged with the small-sized electronic part.

According to the present invention, at least the inner edge side of the projecting portion is made thinner.

The projecting portion can be sandwiched to be pressed and held between the small-sized electronic part and a casing of the mounting object apparatus in a state where the small-sized electronic part is mounted to the mounting object apparatus. The closer a pressing force to a compressed limit of the projecting portion, the larger pressing load can be imposed on the small-sized electronic part and the casing. However, according to the present invention, the inner edge side of the projecting portion is thin. Thus, it is possible to reduce the pressing load imposed on the small-sized electronic part and the casing. Accordingly, the small-sized electronic part and the casing are not deformed.

According to the present invention, an insertion side end of the projecting portion to which the small-sized electronic part can be inserted is round cornered.

According to the present invention, since the insertion side end of the projecting portion to which the small-sized electronic part can be inserted is round cornered, insertion of the small-sized electronic part is facilitated. Accordingly, even when the small-sized electronic part is further reduced in size, a mounting workability with respect to the holder can be maintained.

The projecting portion of the holder of the present invention as described above can be realized specifically by the following modes in relation to the conduction path of the elastic connector portion. According to a first mode of the present invention, in a manner that the projecting portion is not opposed to the conduction path provided on one end side of the holding portion, the projecting portion is provided on the other end side of the holding portion. In other words, the projecting portion is provided in a position outside a position opposing, on the other end side of the holding portion, the conduction path provided on one end side of the holding portion. According to a second mode of the present invention, in a manner that the projecting portion is opposed to the conduction path on one end side of the holding portion, the projecting portion may be provided on the other end side of the holding portion. With this construction, by setting the holder to the mounting object apparatus, the projecting portion may uniaxially press the small electronic apparatus to the board along a conductive connection direction from the electrodes of the small electronic apparatus, the conduction path, to the board electrodes. Therefore, stable conductive connections between the electrodes of the small electronic apparatus and the board electrodes are obtainable.

According to the present invention, a press-contact protrusion can be provided on an outer peripheral surface of the holding portion for performing detachment prevention by coming into contact with the mounting recess of the mounting object apparatus to which the holder accommodating the small electronic apparatus is mounted.

According to the present invention, the pressing protrusion of the holder accommodating the small-sized electronic part press may contact with the mounting recess of the mounting object apparatus to which the holder is mounted, thereby making the holder and the small-sized electronic part be not easily detached from the mounting recess. Accordingly, in assembling the mounting object apparatus, the holder and the small-sized electronic part mounted to the mounting recess do not fall off, so an assembling workability of the mounting object apparatus increases.

According to the present invention, the press-contact protrusion can be inclined in an extraction direction of the holder with respect to the mounting recess.

According to the present invention, since the press-contact protrusion can be inclined in an extraction direction of the holder with respect to the mounting recess, even when the holder accommodating the small-sized electronic part is about to be detached from the mounting recess, the press-contact protrusion can hold on the mounting recess, thereby preventing the detachment of the holder. On the other hand, in mounting the holder to the mounting recess, the press-contact protrusion does not hold on the mounting recess, thereby a smooth mounting of the holder can be performed. Therefore, the holder that can be easily mounted to the mounting recess while being not easily detached therefrom is realized.

According to the first mode of the present invention, in mounting the holder to the mounting recess of the mounting object apparatus, even when the holder is rubbed, the projecting portion engages with the small-sized electronic part, thereby preventing the pressing flange from being rolled up. According to the second mode of the present invention, in mounting the holder to the mounting recess, the projecting portion engages with the small-sized electronic part without being rolled up to be disengaged therefrom.

Consequently, according to the holder of the present invention, after the holder accommodating the small-sized electronic part is mounted to the mounting object apparatus, the conduction path of the elastic connector portion is reliably brought into press contact with the electrode of the small-sized electronic part and the circuit electrode of the board, thereby making it possible to obtain a stable electric connection.

The present invention is not limited to the description as described above. An advantage, characteristics, and an application of the present invention are made further clear by the following embodiments described with reference to the drawings. Further, it should be understood that the scope of the present invention includes all appropriate modifications without departing from the spirit of the present invention.

BRIEF DESCRIPTION OF THE DRAWINGS

In the accompanying drawings:

FIGS. 1A and 1B are explanatory views of a holder according to a first embodiment of the present invention, in which

FIGS. 3A and 3B are explanatory views of a holder according to a second embodiment of the present invention, in which

FIGS. 4A and 4B are explanatory views of a holder according to a third embodiment of the present invention, in which

FIGS. 5A and 5B are explanatory views of a holder according to a fourth embodiment of the present invention, in which

FIGS. 6A to 6E are explanatory views of modifications of the holders according to the first to fourth embodiments, in which

FIGS. 7A and 7B are explanatory views of modifications of a projecting portion, in which

FIGS. 8A and 8B are explanatory views of a modification of an elastic connector portion, in which

FIGS. 9A and 9B are explanatory views of a conventional holder for a small-sized electronic part, in which

DESCRIPTION OF THE PREFERRED EMBODIMENTS

A holder of a small-sized electronic part according to a first embodiment of the present invention will be described below with reference to the drawings. Reference symbols denote portions and members in the drawings. Note that, technical items that are common between embodiments will not be repeatedly explained.

Figure 1A:
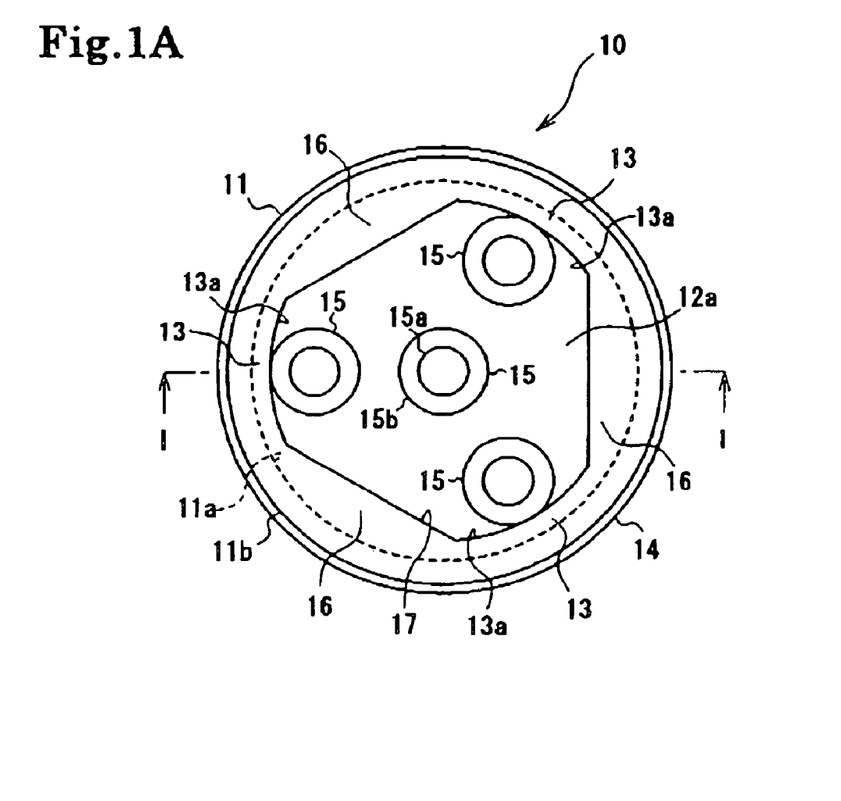
FIG. 1A is a plan view and FIG. 1B is a cross sectional view taken along the line I-I of FIG. 1A.
Figure 1B:
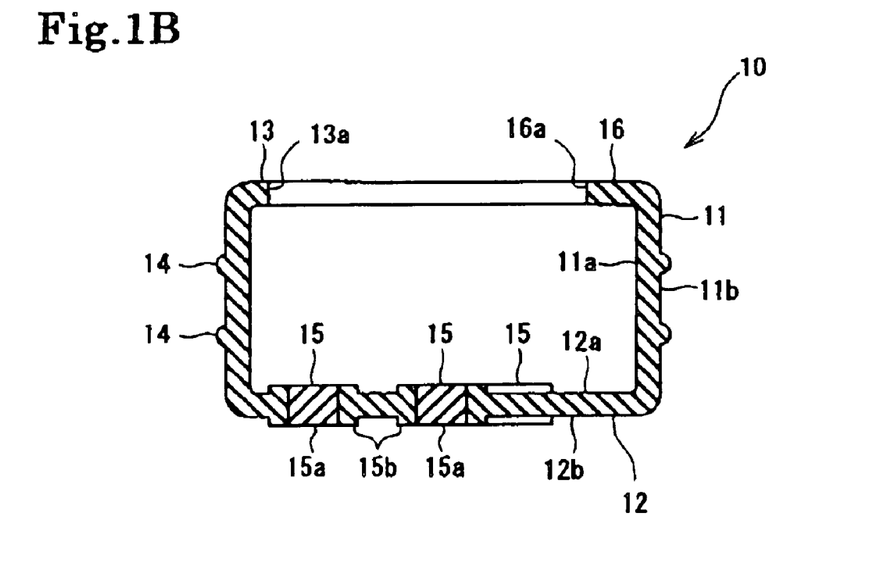
Figure 2:
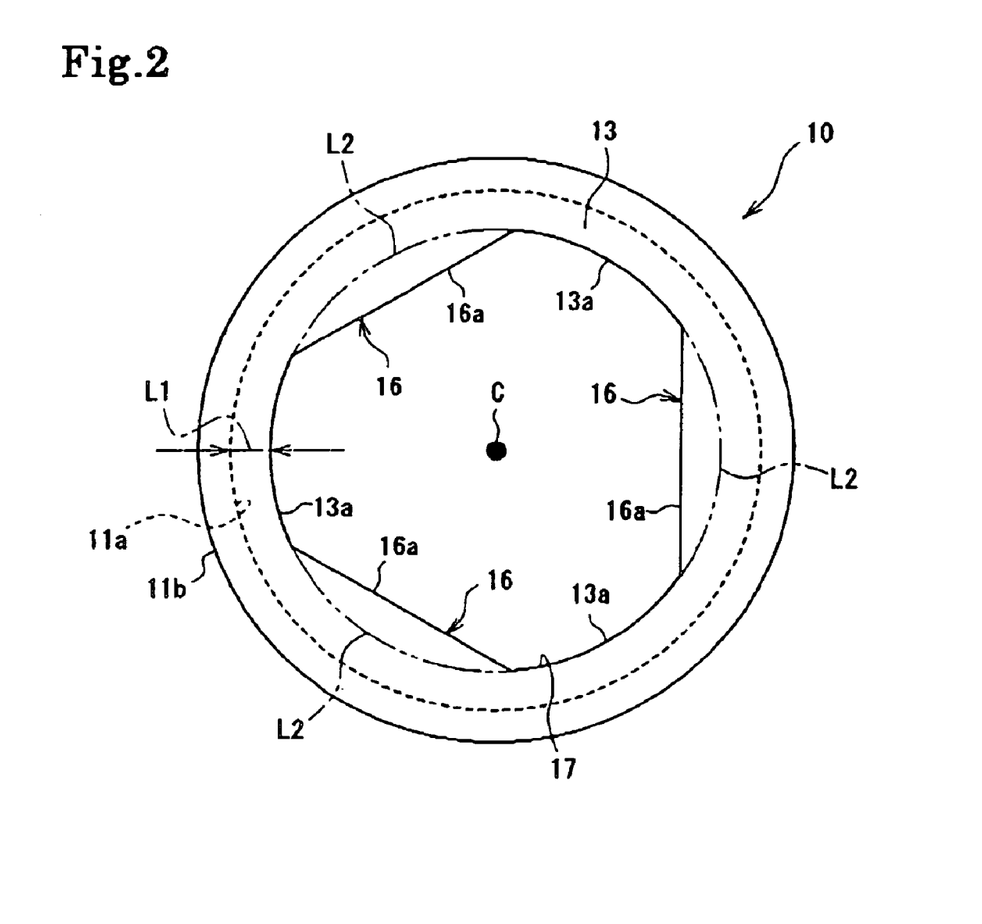
FIG. 2 is a plan view of a main portion schematically showing a relationship between a pressing flange and a projecting portion of the holder of FIGS. 1A and 1B.

First Embodiment {refer to FIGS. 1A, 1B, and 2}: As shown in FIGS. 1A and 1B, a holder (10) of this embodiment includes a holding portion (11), a bottom portion (12), and a pressing flange (13). The holder (10) may be a single mold body.

The holding portion (11) can have a cylindrical shape. A small-sized electronic part (6) (for example, a microphone, a speaker, a receiver, a vibrator, a buzzer, or an electronic part that is a functional combination thereof) may be accommodated on an inner peripheral surface (11a) side of the holding portion (11). On an outer peripheral surface (11b), at least one annular press-contact protrusion (14) can surround an entire periphery of the outer peripheral surface (11b). A press-contact protrusion (14) having a semicircular sectional shape is also within the scope of the invention. The press-contact protrusion (14) can be spaced apart from another press-contact protrusion (14) in a cylinder axis direction of the cylindrical holding portion (11). A press-contact protrusion (14) may serve to prevent the holder (10) from disengaging by press contacting an inner peripheral surface of the mounting recess (8a) formed in a casing (8) of the mounting object apparatus.

On the bottom portion (12), may be at least one elastic connector portion (15). An elastic connector portion (15) can have a cylindrical shape. In addition, an elastic connector portion (15) protruding from both an inner surface (12a) and an outer surface (12b) is also within the scope of the invention. A conduction path (15a) is formed in a central portion of an elastic connector portion (15). An outer peripheral portion (15b) which is a portion of the elastic connector portion (15) other than the conduction path (15a) can retain a shape of the conduction path (15a). Further, the outer peripheral portion (15b) can be formed such that the elastic connector portion (15) may come into contact with one of the electrodes (6a, 6b) of the small-sized electronic part (6) and with one of the circuit electrodes (7a, 7b) of a board (7). The elastic connector portion (15) may come into contact at a wide area including the outer peripheral portion (15b), thereby ensuring stability in contacting state at the conduction path (15a).

The pressing flange (13) may protrude from an upper end of the holding portion (11) inwardly toward the cylinder axis. An inner edge (13a) of the pressing flange (13) at a characteristic point can include at least one projecting portion (16).

A relationship between a projecting portion (16) and the pressing flange (13) according to this embodiment can be described with reference to FIG. 2. The pressing flange (13) according to this embodiment may correspond to an annular portion protruding inwardly from an inner peripheral surface (11a) of the holding portion (11) toward a cylinder axis (C) and having a constant width L1. The projecting portion (16) may correspond to an extended portion that protrudes inwardly from the pressing flange (13) toward the cylinder axis (C) at a portion of the pressing flange (13) a predetermined length (L2). Depicted by a chain double-dashed line within FIG. 2, the predetermined length (L2) can be shown on the inner edge (13a) of the pressing flange (13) as an arc portion. In other words, an inner edge (16a) of the projecting portion (16) can be formed as a line. This line being a straight line is within the scope of the invention. The inner edge (16a) may connect two points on the inner edge (13a) of the pressing flange (13). That is, the pressing flange (13) is a portion protruding inwardly toward the cylinder axis from the upper end of the holding portion (11). This portion may protrude inwardly toward the cylinder axis for a fixed length. Thus, the projecting portion (16) may be an extended portion of the holding portion (11) that further protrudes inwardly toward the cylinder axis from the pressing flange (13). An insertion hole (17) of the holder (10) can be formed of the inner edge (13a) of the pressing flange (13) and the inner edge (16a) of the projecting portion (16).

Here, materials of components of the holder (10) will be described. As a rubber-like elastic material for forming the holder (10), it is possible to use thermosetting elastomer from the group consisting of silicone rubber, natural rubber, isoprene rubber, butadiene rubber, 1, 2-polybutadiene, styrene-butadiene rubber, chloroprene rubber, nitrile rubber, butyl rubber, ethylene propylene rubber, chlorosulfonated polyethylene, acrylic rubber, epichlorohydrin rubber, fluororubber, and urethane rubber. Further, as a rubber-like elastic material for forming the holder (10), it is also possible to use thermoplastic elastomer from the group consisting of styrene-based thermoplastic elastomer, olefin-based thermoplastic elastomer, ester-based thermoplastic elastomer, urethane-based thermoplastic elastomer, amide-based thermoplastic elastomer, vinyl chloride-based thermoplastic elastomer, fluoro-thermoplastic elastomer, and ion-crosslinking thermoplastic elastomer. Of the above-mentioned materials, the silicone rubber can be preferably used as a material in terms of electrical insulation property and whether resistance.

Examples of a magnetic conductive material constituting the conduction path (15a) is from the group consisting of a metal, an alloy, and a metal composite. The magnetic conductive material has a low contact resistance equal to or lower than 10Ω. As such, magnetic conductive material has a low electrical resistance and high electrical conductivity. The magnetic conductive material may be in the form of particles, fibers, or a wire. The metal for magnetic conductive material may be from the group consisting of gold, silver, platinum, iron, aluminum, nickel, palladium, cobalt, and chrome. The alloy for magnetic conductive material can be stainless steel. The metal composite for magnetic conductive material may be obtained by forming a metal coating layer on a resin or ceramic surface. The conduction path (15a) can be formed by arranging the magnetic conductive material in a magnetic orientation in a mold during a molding process of the holder (10).

Operations/effects of the first embodiment: According to the holder (10) of the first embodiment of the present invention, the following operations/effects can be achieved.

The projecting portion (16) can be formed on the pressing flange (13) of the holder (10). Accordingly, when the holder (10) accommodates the small-sized electronic part (6) and then the holder (10) is pressed into the mounting recess (8a) of the mounting object apparatus, even if, for example, portions of the pressing flange (13) having no projecting portion (16) are rolled up to be disengaged from an upper surface of the small-sized electronic part (6) and the holder (10) is about to be detached therefrom, the projecting portions (16) remain to be engaged with the small-sized electronic part (6), thereby preventing the pressing flange (13) from being rolled up. As a result, the conduction path (15a) of the elastic connector portion (15) is reliably caused to connect to at least one electrode (6a, 6b) of the small-sized electronic part (6) and at least one circuit electrode (7a, 7b) of the board (7) in the press contact state, thereby making it possible to obtain a stable electric connection.

A projecting portion (16) of the holder (10) may assist in preventing the pressing flange (13) from being disengaged from the small-sized electronic part (6) and being rolled up. As a result, the width (L1) of the pressing flange (13) can be set shorter than that of the conventional holder (1), thereby increasing a maximum radius of the insertion hole (17) formed in plural types of the pressing flange (13) and having the cylinder axis (C) at a center thereof. Therefore, it is possible to accommodate more easily the small-sized electronic part (6).

Figure 3A:
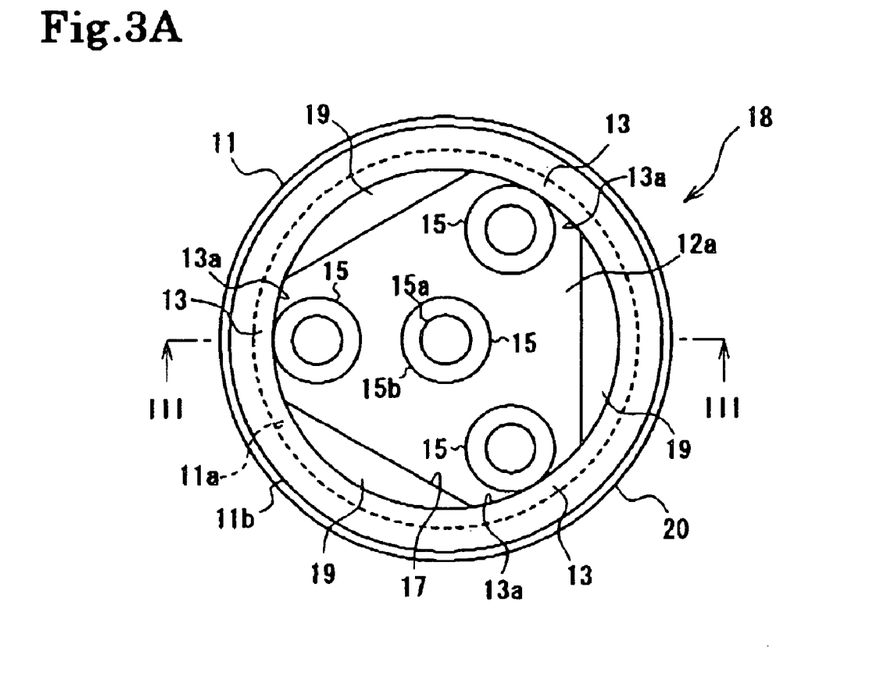
FIG. 3A is a plan view and FIG. 3B is a sectional view taken along the line III-III of FIG. 3A.
Figure 3B:
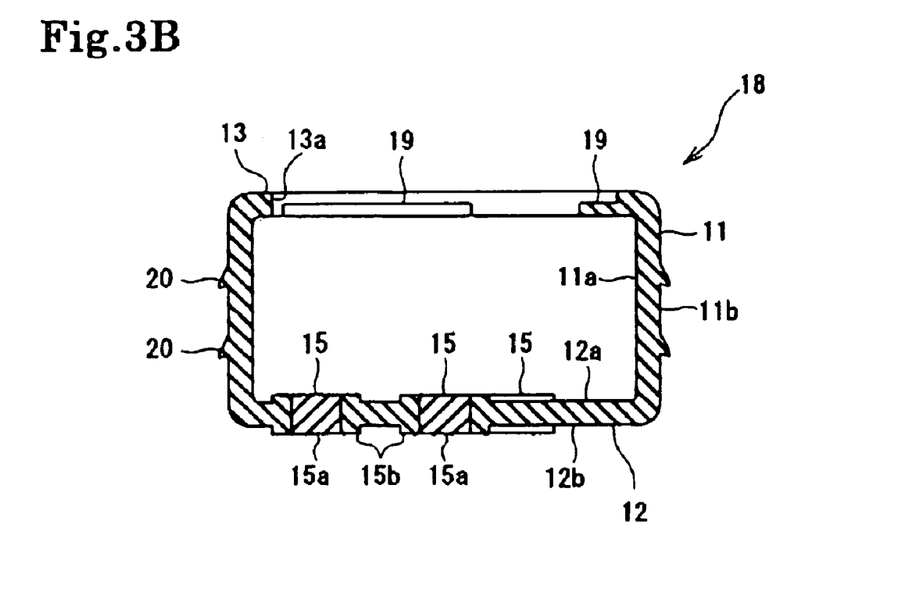

Second Embodiment {refer to FIGS. 3A and 3B}: A holder (18) according to a second embodiment of the present invention is a modification of the holder (10) of the first embodiment which is obtained by changing structures of the projecting portion (16) and the press-contact protrusion (14). The second embodiment is the same as the first embodiment in the other constructions and the operations and effects based on the constructions.

A projecting portion (19) of this embodiment can be formed thin so as to be a cut lower than the pressing flange (13). The projecting portion (16) of the first embodiment has the same thickness as that of the pressing flange (13). In the first embodiment, by mounting the holder (10) accommodating the small-sized electronic part (6) to the mounting object apparatus, the projecting portion (16) may receive high compression between the casing (8) of the mounting object apparatus and the small-sized electronic part (6). The projecting portions (19) of this embodiment are thinner than the pressing flange (13). As a result, it may be possible to reduce substantially or to eliminate the pressing load on the small-sized electronic part (6) and the casing (8).

A press contact protrusion (20) of this embodiment may incline in an extraction direction of the holder (18) with respect to the mounting recess (8a) of the casing (8) of the mounting object apparatus. Accordingly, even when the holder (18) accommodating the small-sized electronic part (6) is about to come off from the mounting recess (8a), the press-contact protrusion (20) can hold on the mounting recess (8a), thereby preventing the detachment of the holder (18). On the other hand, when the holder (18) is mounted to the mounting recess (8a), the press-contact protrusion (20) may incline to the outer peripheral surface (11b) of the holding portion (11). Accordingly, mounting the holder (18) to the mounting recess (8a) can be smoothly performed. That is, the holder (18) can be made easy to insert and not easy to be detached with respect to the mounting recess (8a).

Figure 4A:
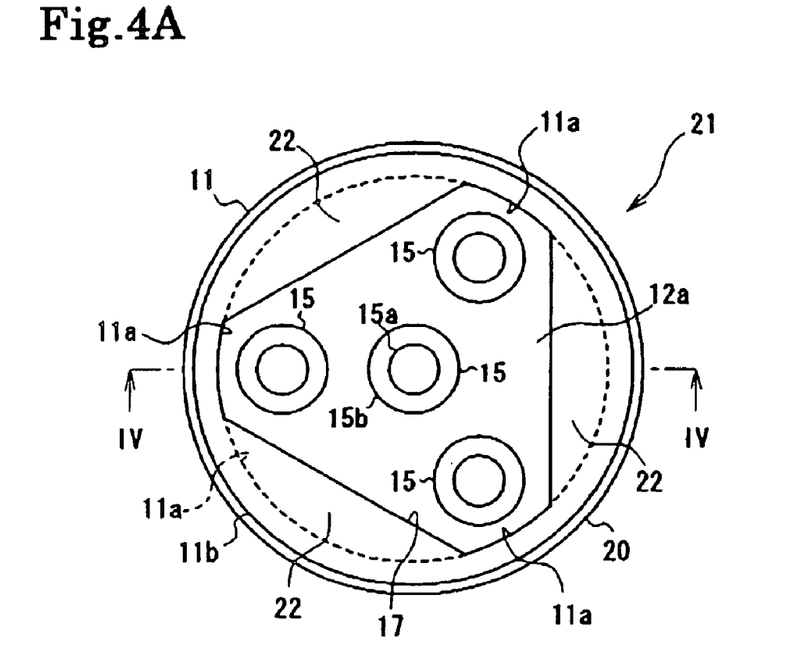
FIG. 4A is a plan view and FIG. 4B is a sectional view taken along the line IV-IV of FIG. 4A.
Figure 4B:
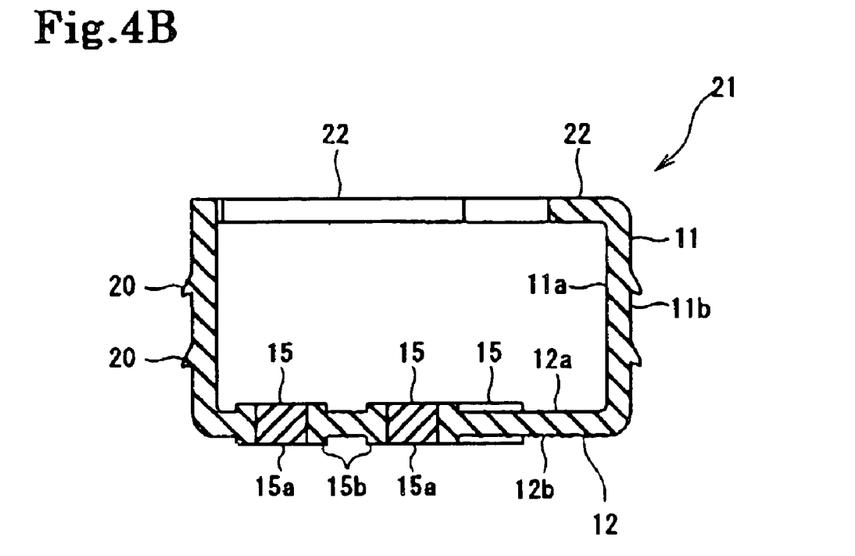

Third Embodiment {refer to FIGS. 4A and 4B}: A holder (21) according to a third embodiment of the present invention is a modification of the holder (10) of the first embodiment. The holder (21) can be obtained by eliminating the annular pressing flange (13). Specifically, the holder (21) may include a projecting portion (22). The holder (21) may also include the press-contact protrusion (20) of the second embodiment. That is, there is provided no pressing flange as a portion protruding inwardly from the upper end of the holding portion (11) toward the cylinder axis for the fixed length. Instead, at least one projecting portion (22) inwardly projects from the upper end of the holding portion (11) toward the cylinder axis for an arbitrary length. The third embodiment is the same as the first embodiment in the other constructions and the operations and effects based on the constructions.

The holder (21) of this embodiment includes no annular pressing flange (13) as that of the holder (10) of the first embodiment. A portion having a predetermined length on the inner edge of the upper end of the inner peripheral surface (11a) of the holding portion (11) may be provided with the projecting portion (22) protruding toward the cylinder axis of the holding portion (11). As shown within FIG. 4A, the portion having a predetermined length on the inner edge of the upper end of the inner peripheral surface (11a) of the holding portion (11) can be an arc portion indicated by dashed line. Even the holder (21) of the third embodiment can securely engage with the small-sized electronic part (6) without the projecting portions (22) being rolled up even when the holding portion (11) slides with the mounting recess (8a) at the time of mounting to the mounting recess (8a).

Figure 5A:
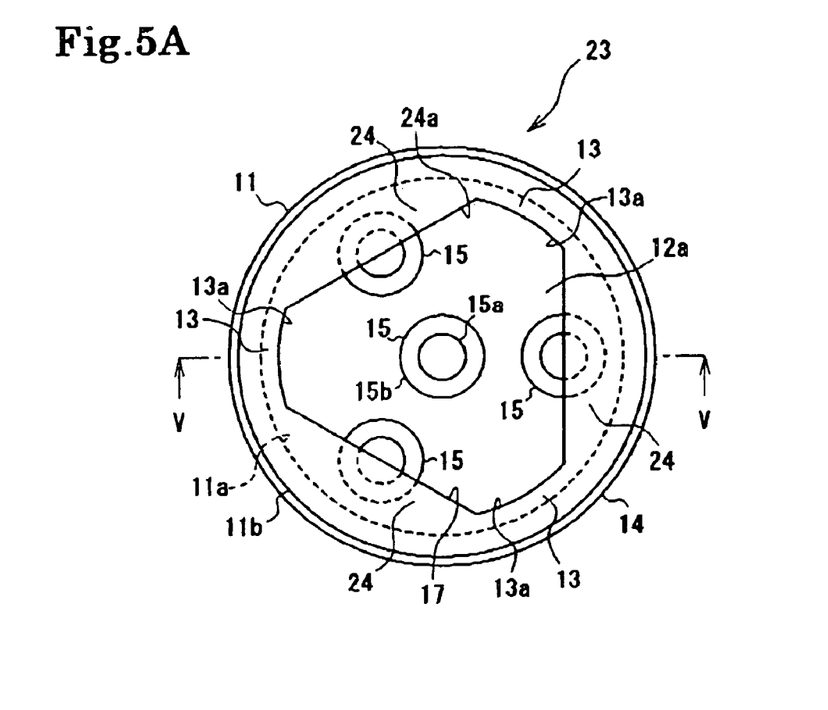
FIG. 5A is a plan view and FIG. 5B is a sectional view taken along the line V-V of FIG. 5A.
Figure 5B:
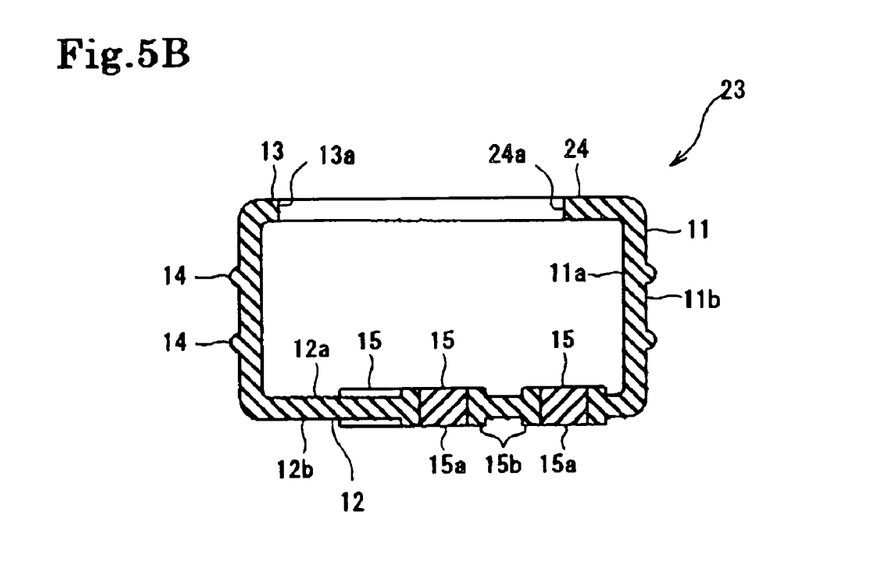

Fourth Embodiment {refer to FIGS. 5A and 5B}: A holder (23) according to a fourth embodiment of the present invention is a modification of the holder (10) of the first embodiment and differs from the first embodiment in that at least one projecting portion (24) is provided so as to be opposed to the conduction path (15a) of the elastic connector portion (15).

The fourth embodiment is the same as the first embodiment in the other constructions and the operations and effects based on the constructions.

The holder (23) of this embodiment includes the three projecting portions (24). A projecting portion (24) may be provided so as to be opposed to the conduction path (15a) positioned below the projecting portion (24). That is, the projecting portion (24) can be formed so as to project to a position in which an inner edge (24a) overlaps with a corresponding conduction path (15a) in a plan view. Accordingly, when the small-sized electronic part (6) is accommodated in the holder (23) and the holder (23) is mounted to the mounting recess (8a) to assemble the mounting object apparatus, the small-sized electronic part can be pressed by the projecting portion (24). A pressing force generated by the above-mentioned pressure can be applied along a direction of a conductive connection of the electrode (6b) of the small-sized electronic part (6), the conduction path (15a) of the elastic connector portion (15), and the circuit electrode (7b) of the board (7). As a result, it is possible to obtain the stable conductive connection between the electrode (6b) and the circuit electrode (7b) through the conduction path (15a).

Modification of the embodiments {refer to FIGS. 6A to 9B}: Modification of the above-mentioned embodiments can be implemented, for example, as described below.

Examples of shapes of the insertion hole for the small-sized electronic part (6) {refer to FIGS. 6A to 6E}: A shape of the insertion hole of the holder for the small-sized electronic part (6) according to the present invention can be realized, for example, as shapes shown in FIGS. 6A to 6E. The other constructions shown in FIGS. 6A to 6E are the same as that of the first embodiment of the present invention, but this modification can be applied to the second to fourth embodiments of the present invention.

Figure 6A:
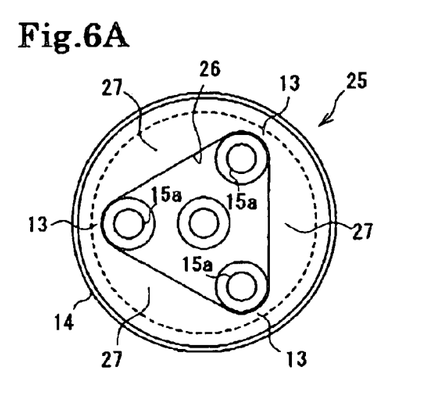
FIG. 6A is a plan view of a first modification.

An insertion hole (26) of a holder (25) shown in FIG. 6A may constitute a triangular shape with round corners, whereby the insertion hole (26) is formed of inner edges of projecting portions (27) and the inner edges of pressing flanges (13).

Figure 6B:
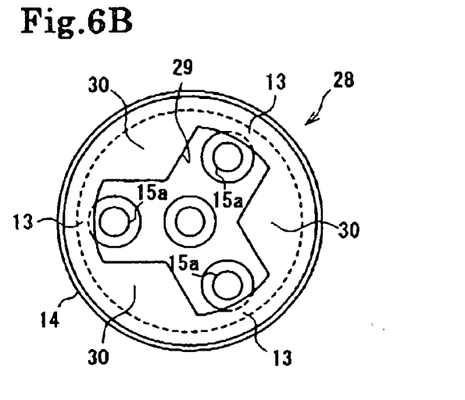
FIG. 6B is a plan view of a second modification.

An insertion hole (29) of a holder (28) shown in FIG. 6B may include projecting portions (30) each of which has an inner edge of two sides rather than a single straight line. The inner edges of the projecting portions (30) and the inner edges of the pressing flange (13) form the insertion hole (29).

Figure 6C:
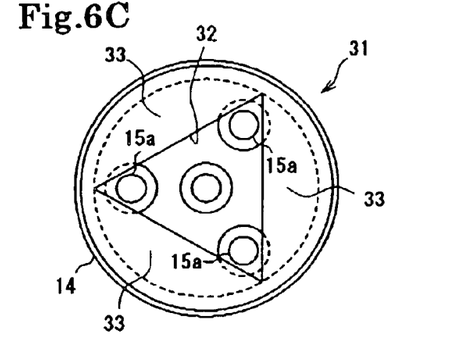
FIG. 6C is a plan view of a third modification.

An insertion hole (32) of the holder (31) shown in FIG. 6C may constitute a triangular shape, wherein inner edges of projecting portions (33) form the insertion hole (32).

Figure 6D:
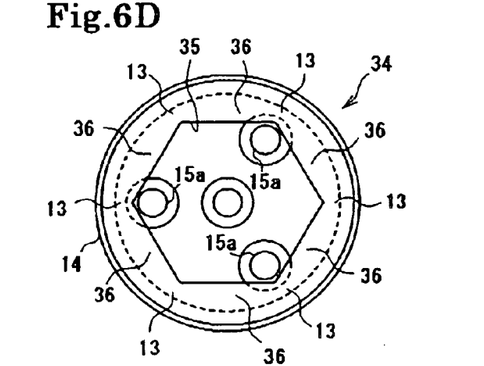
FIG. 6D is a plan view of a fourth modification.

An insertion hole (35) of a holder (34) shown in FIG. 6D may constitute a hexagonal shape (specifically, regular hexagonal shape), and inner edges of projecting portions (36) and the inner edges of the pressing flange (13) form the insertion hole (35). Note that, the insertion hole (35) may assume other polygonal shapes instead of the hexagonal shape.

Figure 6E:
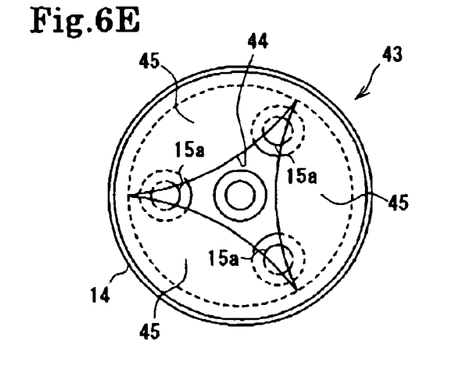
FIG. 6E is a plan view of a fifth modification.

An insertion hole (44) of a holder (43) shown in FIG. 6E may constitute a triangular shape having three arc sides warped inwardly, and inner edges of projecting portions (45) form the insertion hole (44). The projecting portions (45) are provided so as to be opposed to the conduction paths (15a).

Figure 7A:
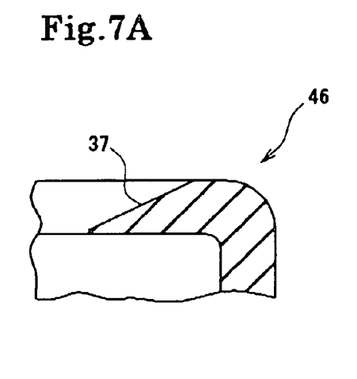
FIG. 7A is a sectional view of a modification and FIG. 7B is a sectional view of another modification.
Figure 7B:
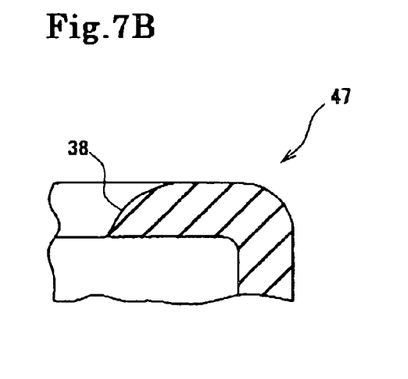

Examples of a sectional shape for making the projecting portion thin {refer to FIGS. 7A and 7B}: According to the first embodiment, the projecting portion having the same thickness as that of the pressing flange (13) is shown in the section as an example. According to the second embodiment, the thin projecting portion entirely a cut lower than the pressing flange (13) is shown in the section as another example. However, as still another examples of the projecting portion of the holder for making the projecting portion thin according to the present invention, there may be provided a holder (46, 47) including thinner projecting portions (37, 38) having sectional shapes shown in FIGS. 7A and 7B, respectively. The projecting portions (37, 38) each have a distal end which forms the insertion holes for the small-sized electronic part (6) and which is not square cornered but round cornered. Therefore, there is an advantage in that even the small-sized electronic part (6) or further miniaturized small-sized electronic part (6) is easily mounted to the holder having the projecting portions (37, 38).

Figure 8A:
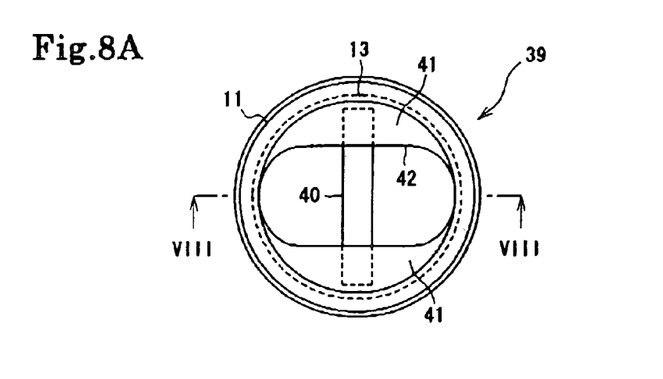
FIG. 8A is a plan view and FIG. 8B is a sectional view taken along the line VIII-VIII of FIG. 8A.
Figure 8B:
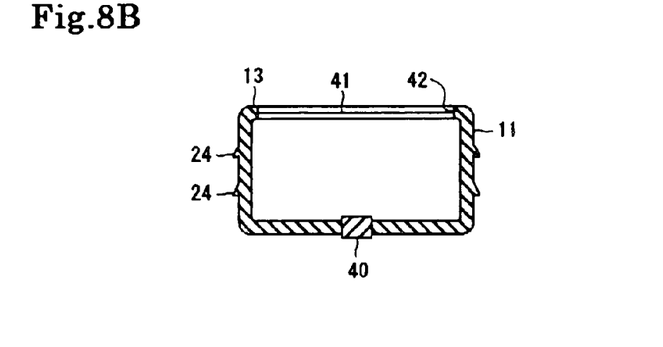

Modification of the elastic connector portion {refer to FIGS. 8A and 8B}: The holder (10, 18, 21, 23, 25, 28, 31, 34) of the above-mentioned embodiments and the modifications includes as an example the elastic connector portions (15) each having at the center thereof the conduction path (15a) obtained by arranging the magnetic conductive material in the magnetic orientation. In the holder (10, 18, 21, 23, 25, 28, 31, 34), the elastic connector portions (15) and the holding portion (11) may be structured as a single mold body formed of the rubber-like elastic material. However, this structure should not be construed restrictively. For example, it is also possible to mold the elastic connector portions in advance, insert those portions in a mold of the holding portion, and then integrate the elastic connector portions and the holding portion with each other to form the single mold body. A holder (39) of FIGS. 8A and 8B is an example thereof. That is, the holder (39) of FIGS. 8A and 8B may include the holding portion (11), an elastic connector portion (40) having a rectangular parallelepiped shape, and projecting portions (41). As such, the elastic connector portion (40), it is possible to use an elastic connector having a metal thin line embedded therein, a zebra connector having a structure in which conductive rubber and insulating rubber are alternately arranged to be integrated with each other, etc. As a matter of course, similarly to the elastic connector portion (15), a columnar elastic connector made by arranging the magnetic conductive material in the magnetic orientation to form the conduction path may be used. Consequently, it is possible to realize a holder having a projecting portion and an elastic connector portion compatible with various types of the small-sized electronic part (6) regardless of a difference in type of the small-sized electronic part (6) or in shape of electrodes. Note that, FIGS. 8A and 8B each show as examples the rod-like rectangular elastic connector portion (40) and an elliptical insertion hole (42) for the small-sized electronic part (6), which is formed of inner edges of the pressing flange (13) and the projecting portions (41). However, as a matter of course, the elastic connector portion (40) and the insertion hole (42) may be endowed with any other configuration.

What is claimed is:

1. A holder for a small-sized electronic part, comprising:
a cylindrical holding portion having a cylinder axis and an inner peripheral surface for accommodating the small-sized electronic part;
an elastic connector portion provided on one end side of the holding portion and having a conduction path for bringing electrodes of the small-sized electronic part accommodated in the holding portion and circuit electrodes of a board into conduction;
a pressing flange provided on another end side of the holding portion and protruding inwardly toward the cylinder axis from the inner peripheral surface of the holding portion and forming an insertion hole for the small-sized electronic part; and
a projecting portion protruding further inwardly from the pressing flange toward the cylinder axis of the holding portion.

2. A holder for the small-sized electronic part according to claim 1, wherein the projecting portion is thin on at least an inner edge side of the projecting portion.

3. A holder for the small-sized electronic part according to claim 1, wherein the projecting portion is round cornered at an insertion side end portion to which the small-sized electronic part is inserted.

4. A holder for the small-sized electronic part according to claim 1, wherein the projecting portion is provided on the another end side of the holding portion in a position which is other than a position opposed to the conduction path on the one end side of the holding portion.

5. A holder for the small-sized electronic part according to claim 1, wherein the projecting portion is provided on the another end side of the holding portion in a position opposed to the conduction path on the one end side of the holding portion.

6. A holder according to claim 1, wherein the projecting portion is thinner than the pressing flange.

7. A holder according to claim 1, wherein the projecting portion includes a step oriented away from the one end side of the holding portion.

8. A holder according to claim 1, wherein the insertion hole has a triangular shape with round corners.

9. A holder according to claim 1, wherein the insertion hole has a regular polygonal shape.

10. A holder for the small-sized electronic part according to claim 1, wherein an outer peripheral surface of the holding portion is provided with a press-contact protrusion for preventing detachment of the holder by contacting to a mounting recess of a mounting object apparatus.

11. A holder for the small-sized electronic part according to claim 10, wherein the press-contact protrusion is inclined in an extraction direction of the holder with respect to the mounting recess.

12. A holder for a small-sized electronic part, comprising:
a cylindrical holding portion having a cylinder axis and an inner peripheral surface for accommodating the small-sized electronic part;
an elastic connector portion provided on one end side of the holding portion and having a conduction path for bringing electrodes of the small-sized electronic part accommodated in the holding portion and circuit electrodes of a board into conduction; and
a projecting portion, located on another end side of the holding portion, having an inner lateral surface, and protruding inwardly such that a distance between the inner lateral surface and the cylinder axis varies circumferentially.

13. A holder for the small-sized electronic part according to claim 12, wherein the projecting portion is thin on at least an inner edge side of the projecting portion.

14. A holder for the small-sized electronic part according to claim 12, wherein the projecting portion is round cornered at an insertion side end portion to which the small-sized electronic part is inserted.

15. A holder for the small-sized electronic part according to claim 12, wherein the projecting portion is provided on the another end side of the holding portion in a position which is other than a position opposed to the conduction path on the one end side of the holding portion.

16. A holder for the smell-sized electronic part according to claim 12, wherein the projecting portion is provided on the another end side of the holding portion in a position opposed to the conduction path on the one end side of the holding portion.

17. A holder according to claim 12, wherein the insertion hole has a triangular shape with round corners.

18. A holder according to claim 12, wherein the insertion hole has a regular polygonal shape.

19. A holder for the small-sized electronic part according to claim 12, wherein an outer peripheral surface of the holding portion is provided with a press-contact protrusion for preventing detachment of the holder by contacting to a mounting recess of a mounting object apparatus.

20. A holder for the small-sized electronic part according to claim 19, wherein the press-contact protrusion is inclined in an extraction direction of the holder with respect to the mounting recess.

21. A holder for the small-sized electronic part according to claim 1, wherein a thickness of the projecting portion tapers inwardly.

22. A holder for the small-sized electronic part according to claim 12, wherein a thickness of the projecting portion tapers inwardly.

* * * * *